United States Patent [19]

Shiomi et al.

[11] Patent Number: 4,791,382
[45] Date of Patent: Dec. 13, 1988

[54] DRIVER CIRCUIT

[75] Inventors: Toru Shiomi; Kenji Anami, both of Hyogo, Japan

[73] Assignee: Mitsubishi Denki Kabushiki Kaisha, Tokyo, Japan

[21] Appl. No.: 156,433

[22] Filed: Feb. 16, 1988

[30] Foreign Application Priority Data

Aug. 25, 1987 [JP] Japan ................ 62-210603

[51] Int. Cl.$^4$ .................. H03F 3/18; H03F 3/16
[52] U.S. Cl. .................. 330/264; 307/270; 307/451; 330/300
[58] Field of Search ............ 307/262, 263, 270, 300, 307/451, 499, 500, 501; 330/264, 300

[56] References Cited

U.S. PATENT DOCUMENTS

| | | | |
|---|---|---|---|
| 4,176,289 | 11/1979 | Leach et al. | 307/270 |
| 4,284,957 | 8/1981 | Hague | 330/300 X |
| 4,313,065 | 1/1982 | Yoshida et al. | 330/264 X |
| 4,446,444 | 5/1984 | Patterson, III | 330/264 |

OTHER PUBLICATIONS

IEEE Journal of Solid-State Circuits, "13-ns, 500-m W, 64-kbit ECL RAM Using HI-BICMOS Technology" by K. Ogiue et al., vol. Sc-21, No. 5, Oct. 1986, pp. 681–684.

Primary Examiner—Eugene R. Laroche
Assistant Examiner—Steven J. Mottola
Attorney, Agent, or Firm—Lowe, Price, LeBlanc, Becker & Shur

[57] ABSTRACT

A driver circuit comprises a bipolar transistor for passing current from a power supply potential $V_{CC}$ to an output terminal, two CMOS inverters connected between an input terminal and the output terminal, a diode for passing current from the output terminal to the input terminal, and an NMOSFET for passing current from the input terminal to a power supply potential $V_{EE}$. When a signal applied to the input terminal falls from an "H" level to an "L" level, the potential of the output terminal is changed from $V_{CC}$ to $V_{EE}$. At the time, current flows from the output terminal to the input terminal through the diode. In addition, the current flows to the power supply potential $V_{EE}$ through the NMOSFET. When the signal applied to the input terminal rises from the "L" level to the "H" level, the potential of the output terminal is changed from the $V_{EE}$ to the $V_{CC}$. At that time, current flows from the power supply potential $V_{CC}$ to the output terminal through the bipolar transistor.

10 Claims, 6 Drawing Sheets

DRIVER CIRCUIT

BACKGROUND OF THE INVENTION

1. Field of the Invention

The present invention relates to a driver circuit for amplifying current of an input signal of a first logical level or a second logical level and supplying the amplified signal to a load.

2. Description of the Prior Art

A driver circuit for amplifying current of a given signal and supplying the amplified current to a load has been used in various circuit devices. A driver circuit used in a Bi-CMOS (complementary metal oxide semiconductor) RAM (random access memory) disclosed in IEEE JOURNAL OF SOLID STATE CIRCUITS, Vol. SC-21, No. 5, Oct. 1986, pp. 681-684 is described by way of example.

Description is now made on a schematic structure of the Bi-CMOS·RAM.

The Bi-CMOS·RAM was developed to obtain a large capacity memory capable of performing high-speed operation and having a reduced consumed power, and comprises a combination of a bipolar and a CMOS. FIG. 1 illustrates a structure of a general RAM.

In FIG. 1, a plurality of word lines and a plurality of bit lines are arranged to intersect with each other in a memory cell array 50, memory cells being arranged at intersections of the word lines and the bit lines. A single word line in the memory cell array 50 is selected by an X address buffer decoder 52 and a single bit line in the memory cell array 50 is selected by a Y address buffer decoder 54, so that a memory cell provided at an intersection of the word line and the bit line is selected. Data is written into the selected memory cell or data stored in the memory cell is read out. Writing or reading of data is selected by a read/write control signal R/W applied to an R/W (read/write) control circuit 56. At the time of writing data, input data Din is inputted to the selected memory cell through the R/W control circuit 56. In addition, at the time of reading data, the data stored in the selected memory cell is detected and amplified by a sense amplifier 58, and provided to the exterior as output data Dout through a data output buffer 60.

In the Bi-CMOS·RAM, a memory cell array comprises an MOS transistor, and a peripheral circuit such as an address buffer decoder comprises a bipolar transistor or a combination of the bipolar transistor and the MOS transistor.

FIG. 2 is block diagram showing a structure of an address buffer decoder.

In FIG. 2, a plurality of address terminals 70 are connected to input terminals of a decoder circuit 78 through address buffer circuits 72, level converting circuits 74, and driver circuits 76, respectively.

Each of the address buffer circuits 72 comprises a bipolar ECL (emitter coupled logic) circuit, and an address signal at an ECL level (the potential at an "H" level = −0.9 V and the potential at an "L" level = −1.7 V) is inputted to each of the address terminals 70. Each of the level converting circuits 74 comprises a CMOS, and converts the address signal of the ECL level outputted from each of the address buffer circuits 72 into an address signal of an MOS level (the potential at an "H" level = 0 V and the potential at an "L" level = −4.5 V). Each of the driver circuits 76 comprises a CMOS and a bipolar transistor having high driving ability. The decoder circuit 78 decodes a binary signal comprising a plurality of address signals and applies a selecting signal to one of a plurality of selecting lines 80. Therefore, a memory cell on the selecting line is selected.

FIG. 3 is a diagram showing a circuit structure of a driver circuit.

In FIG. 3, a CMOS inverter 93 comprising a PMOSFET (p-channel metal oxide semiconductor field effect transistor) 91 and an NMOSFET (n-channel metal oxide semiconductor field effect transistor) 92 has an input terminal connected to an input terminal 90. The CMOS inverter 93 has an output terminal connected to a base of a bipolar transistor 94. The bipolar transistor 94 has a collector coupled to a power supply potential $V_{CC}$ (0 V) and an emitter connected to an output terminal 98. On the other hand, an NMOSFET 95 has a gate connected to the input terminal 90, a drain connected to the output terminal 98 and a source connected to a drain of an NMOSFET 96 and a base of a bipolar transistor 97. The NMOSFET 96 has a gate connected to the output terminal 98 and a source coupled to a power supply potential $V_{EE}$ −4.5 V). The bipolar transistor 97 has a collector connected to the output terminal 98 and an emitter coupled to the power supply potential $V_{EE}$.

Description is now made on operation of the driver circuit shown in FIG. 3.

If and when a signal applied to the input terminal 90 is changed from an "H" level to an "L" level, the PMOSFET 91 is turned on and the NMOSFETs 92 and 95 are turned off. Therefore, since the potential of the base of the bipolar transistor 94 attains the "H" level ($V_{CC}$), the transistor 94 is turned on. At that time, since the NMOSFET 96 is turned on, the base potential of the bipolar transistor 97 attains the "L" level ($V_{EE}$), so that the transistor 97 is turned off. Thus, an output signal derived from the output terminal 98 is changed from the "L" level to the "H" level.

On the other hand, if and when the signal applied to the input terminal 90 is changed from the "L" level to the "H" level, the NMOSFETs 92 and 95 are turned on and the PMOSFET 91 and the NMOSFET 96 are turned off. Therefore, the bipolar transistor 94 is turned off and the bipolar transistor 97 is turned on. Thus, the output signal derived from the output terminal 98 is changed from the "H" level to the "L" level.

Since large load capacitance is generally connected to the output terminal of the driver circuit, an output stage in the conventional driver circuit includes a bipolar transistor having high load-driving ability. Therefore, both of the "H" and "L" levels of the output signal derived to the output terminal 98 is decreased by voltage $V_{BE}$ between the base and the emitter of each of the bipolar transistors 94 and 97, as represented by a dotted line in FIG. 4.

SUMMARY OF THE INVENTION

A primary object of the presnt invention is to provide a driver circuit capable of changing an output level from a first power supply potential to a second power supply potential without deteriorating high-speed performance.

The driver circuit according to the present invention is to amplify current of an input signal of a first logical level or the second logical level and supply the amplified current to a load. The driver circuit comprises an input terminal coupled to an input signal, an output terminal, a first potential source for applying a potential correspondng to the first logical level, a second potential source for applying a potential corresponding to the second logical level, a first CMOS inverter circuit responsive to the signal applied to the input terminal for deriving to the output terminal the potential of the first potential source or the potential of the second potential source, a first semiconductor element for passing current from the first potential source to the output terminal when the signal applied to the input terminal is changed from the second logical level to the first logical level, and a second semiconductor element for passing current from the output terminal to the second potential source when the signal applied to the input terminal is changed from the first logical level to the second logical level.

In the driver circuit according to the present invention, when the signal applied to the input terminal is changed from the second logical level to the first logical level, current flows from the first potential source to the output terminal by the first semiconductor element. Therefore, the potential of the output terminal is changed from the second logical level to the first logical level at the high speed.

Furthermore, when the signal applied to the input terminal is changed from the first logical level to the second logical level, current flows from the output terminal to the second potential source by the second semiconductor element. Therefore, the potential of the output terminal is changed from the first logical level to the second logical level at the high speed.

Since an output signal of the CMOS inverter circuit is derived to the output terminal, the output signal is largely changed from the potential of the first potential source to the potential of the second potential source.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
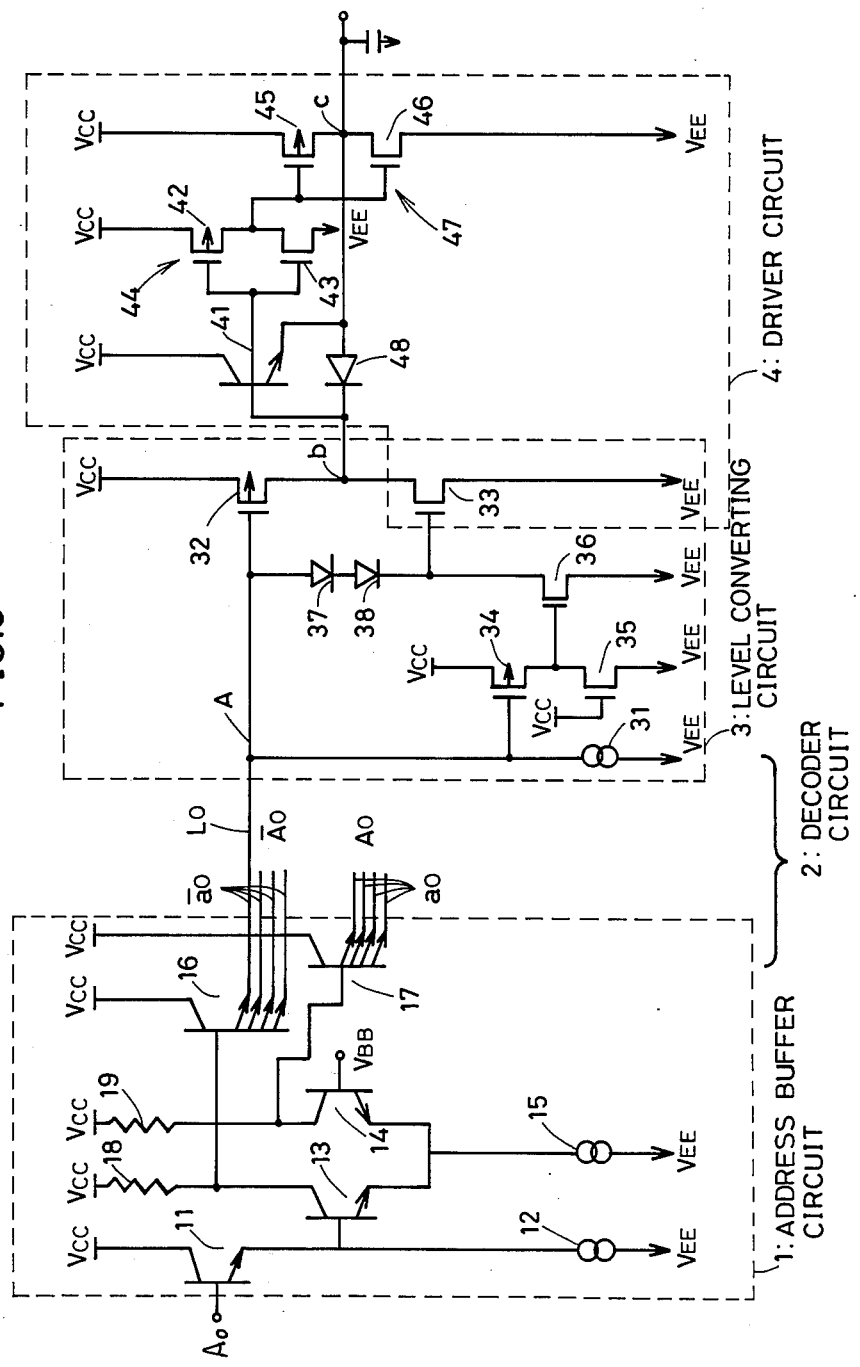
FIG. 5 is a circuit diagram showing a structure of selecting means in a Bi-CMOS·RAM using a driver circuit according to an embodiment of the present invention.
Figure 6:
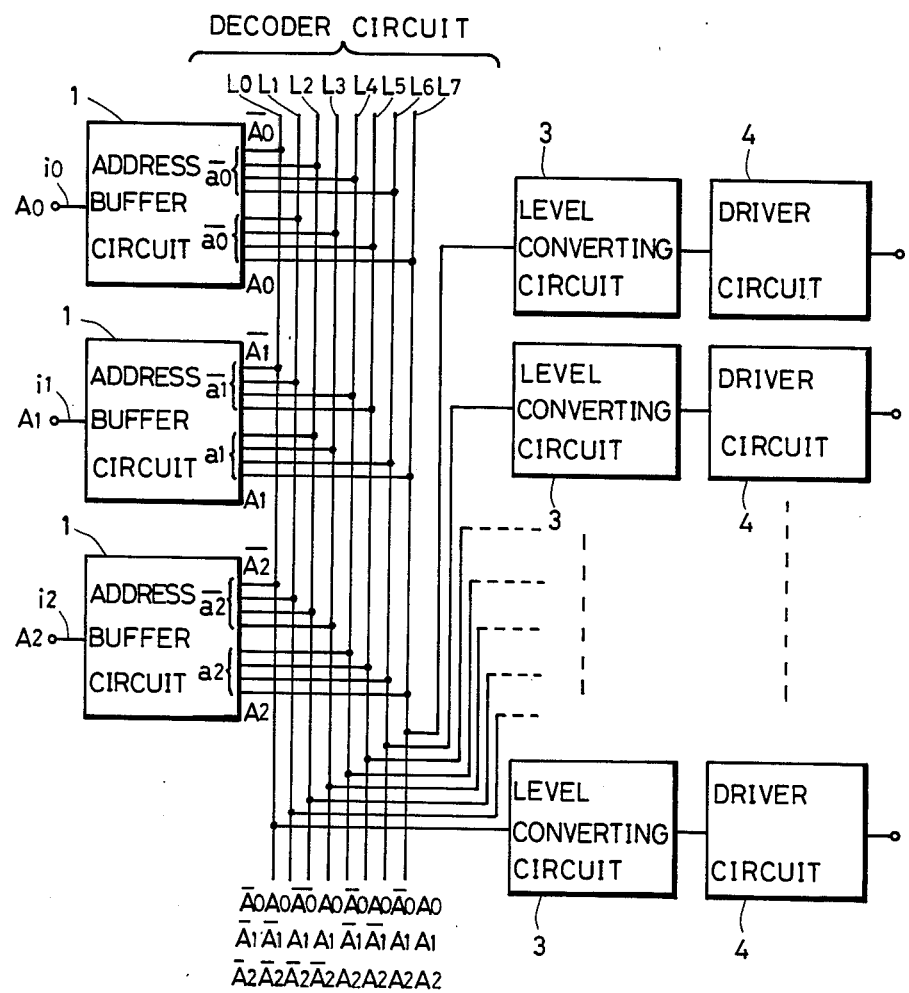
FIG. 6 is a block diagram showing a structure of the selecting means in the Bi-CMOS·RAM.

Referring now to FIGS. 5 and 6, description is made on an embodiment of the present invention.

In the present embodiment, a driver circuit according to the present invention is applied to an address buffer decoder in a Bi-CMOS·RAM.

FIG. 6 illustrates a structure of the address buffer decoder in the Bi-CMOS·RAM.

Figure 1:
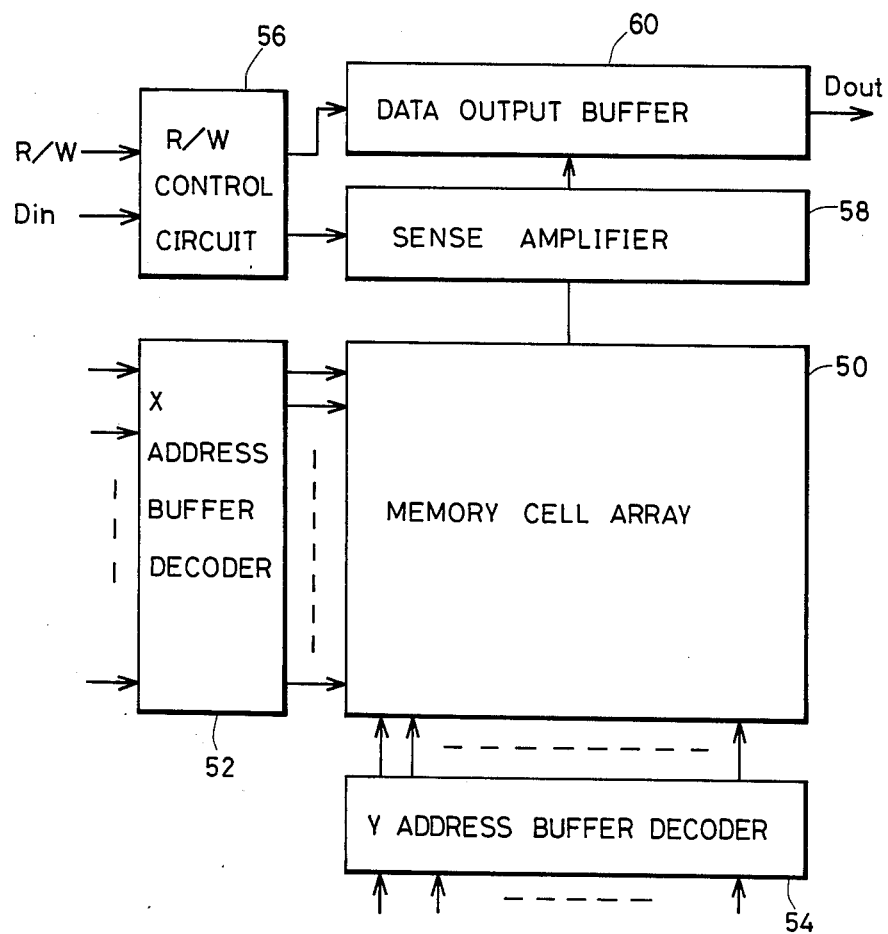
FIG. 1 is a block diagram showing an entire structure of a RAM.
Figure 2:
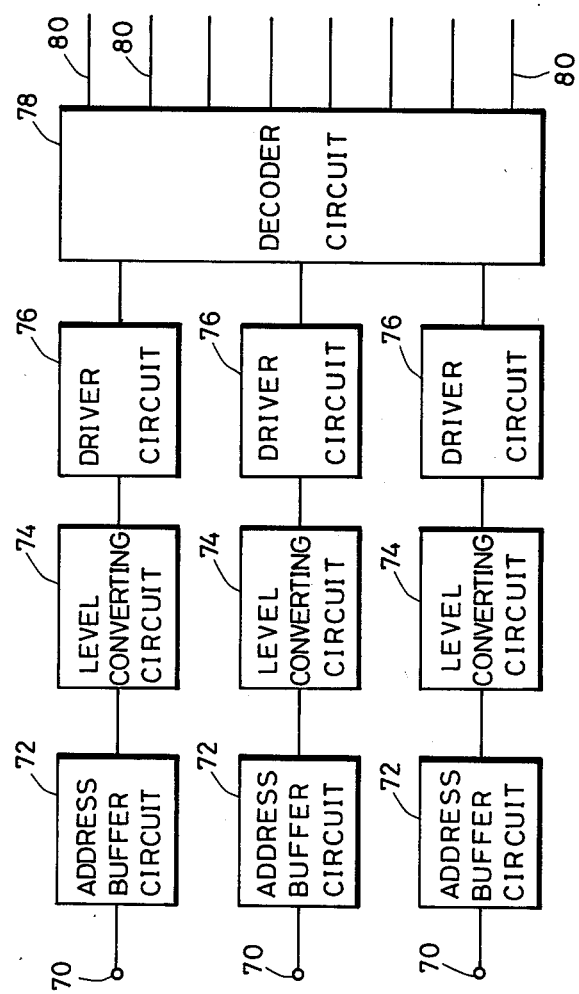
FIG. 2 is a block diagram showing a structure of selecting means in a conventional Bi-CMOS·RAM.
Figure 3:
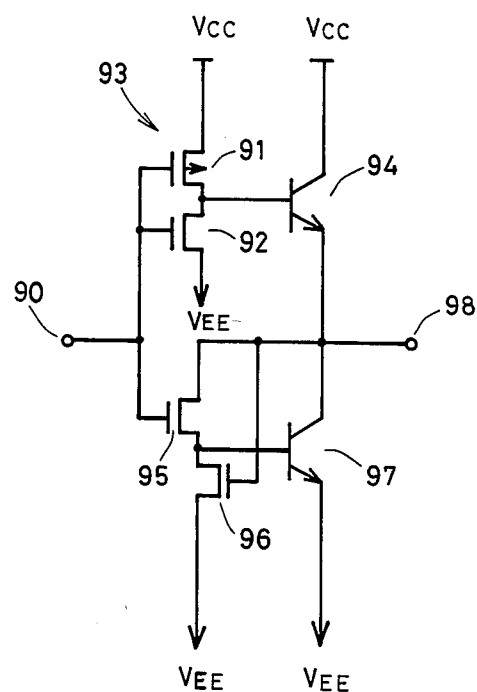
FIG. 3 is a circuit diagram showing a structure of a driver circuit in the conventional Bi-CMOS·RAM.
Figure 4:
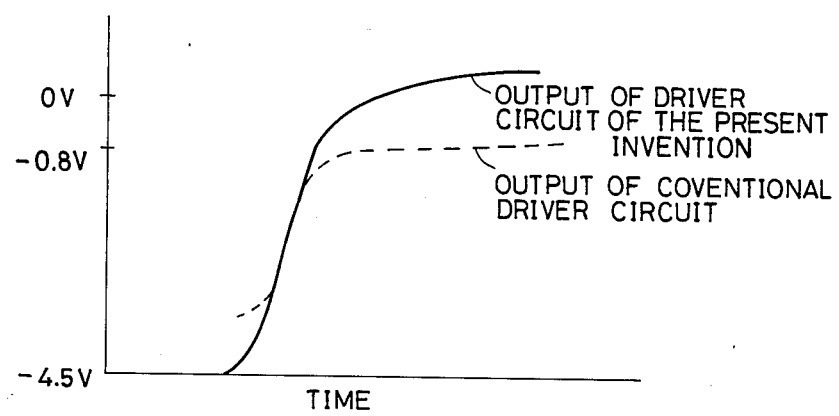
FIG. 4 is a waveform diagram showing an output of the conventional driver circuit and a driver circuit according to the present invention.

The address buffer decoder comprises n address buffer circuits 1, a decoder circuit 2, $2^n$ level converting circuits, 3, and $2^n$ driver circuits 4. In FIG. 3, the case of n=3 is illustrated.

A first address buffer circuit 1 comprises an input terminal $i_0$, four output terminals $a_0$ and four inverted output terminals $\overline{a_0}$. A second address buffer circuit 1 comprises an input terminal $i_1$, four output terminals $a_1$ and four inverted output terminals $\overline{a_1}$. A third address buffer circuit 1 comprises an input terminal $i_2$, four output terminals $a_2$ and four inverted output terminals $\overline{a_2}$. Address signals $A_0$, $A_1$ and $A_2$ of an ECL level are applied to the input terminals $i_0$, $i_1$ and $i_2$, respectively. Signals $A_0$, $A_1$ and $A_2$ of the same logical level as those of the address signals are outputted from the output terminals $a_0$, $a_1$ and $a_2$, respectively, and signals $\overline{A_0}$, $\overline{A_1}$ and $\overline{A_2}$ of the logical level opposite to those of the address signals are outputted from the inverted output terminals $\overline{a_0}$, $\overline{a_1}$ and $\overline{a_2}$, respectively. Each of the respective output terminals $a_0$, $a_1$ and $a_2$ and each of the respective inverted output terminals $\overline{a_0}$, $\overline{a_1}$ and $\overline{a_2}$ in the address buffer circuits 1 are connected to any of eight interconnections L0 to L7. For example, ones of the inverted output terminals $\overline{a_0}$, $\overline{a_1}$ and $\overline{a_2}$ are connected to the interconnection L0, one of the output terminals $a_0$ and ones of the inverted output terminals $\overline{a_1}$ and $\overline{a_2}$ are connected to the interconnection L1, and one of the output terminals $a_1$ and ones of the inverted output terminals $\overline{a_0}$ and $\overline{a_2}$ are connected to the interconnection L2. The connections are of wired OR, in which only when all of the potentials of the output terminals or the inverted output terminals each connected to each of the interconnections L0 to L7 attain an "L" level, the potential of the interconnection attains the "L" level. The decoder circuit 2 is formed by such connections. The potential of only one of the interconnections L0 to L7 attains the "L" level depending on combination of the address signals $A_0$, $A_1$ and $A_2$ inputted to three address buffer circuits 1, so that the interconnection is selected.

The level converting circuits 3 and the driver circuits 4 are sequentially connected to the interconnections L0 to L7, respectively. Selecting lines are connected to output terminals of the driver circuits 4, respectively, and a plurality of memory cells are connected to each of the selecting lines.

FIG. 5 is a diagram showing a specific circuit structure of the address buffer decoder.

In FIG. 5, a single address buffer circuit 1, a single level converting circuit 3 and a single driver circuit 4 are illustrated.

Description is now made on the address buffer circuit 1. A bipolar transistor 11 has a base coupled to an address signal $A_0$, a collector connected to a power supply potential $V_{CC}$ (0 V) and an emitter connected to a power supply potential $V_{EE}$ (−4.5 V) through a constant current source 12. A bipolar transistor 13 has a base connected to the emitter of the bipolar transistor 11 and a collector connected to the power supply potential $V_{CC}$ through a resistor 18. A bipolar transistor 14 has a base coupled to a reference potential $V_{BB}$ and a collector connected to the power supply potential $V_{CC}$ through a resistor 19. Each of the transistors 13 and 14 has an emitter connected to the power supply potential $V_{EE}$ through a constant current source 15.

A first multi-emitter transistor 16 has a base connected to the collector of the bipolar transistor 13. A second multi-emitter transistor 17 has a base connected to the collector of the bipolar transistor 14. Each of the multi-emitter transistors 16 and 17 has a collector connected to the power supply potential $V_{CC}$. Each of the multi-emitter transistors 16 and 17 has emitters, the respective emitters being output nodes $\overline{a_0}$ and $a_0$ in the address buffer circuit 1, and each of the output nodes $\overline{a_0}$ and $a_0$ being connected to any of the interconnections L0 to L7. An output signal $A_0$ of the same logical level as that of the address signal $A_0$ is derived to the output node $a_0$, and an output signal $\overline{A_0}$ of the logical level opposite to that of the address signal $A_0$ is derived to the output node $\overline{a_0}$. In FIG. 5, only the interconnection L0 and the level converting circuit 3 and the driver circuit 4 each connected to the interconnection L0 are illustrated.

Description is now made on the level converting circuit 3. The interconnection L0 is connected to a gate of a PMOSFET (p-channel metal oxide semiconductor field effect transistor) 32 and connected to a power supply potential $V_{EE}$ through a constant current source 31. The PMOSFET 32 has a source connected to a power supply potential $V_{CC}$ and a drain connected to a drain of n NMOSFET (n-channel MOSFET) 33. The NMOSFET 33 has a source connected to the power supply potential $V_{EE}$. A node of the drains of the PMOSFET 32 and the NMOSFET 33 is an output node b. In addition, the gate of the PMOSFET 32 is connected to a gate of the NMOSFET 33 through level shift diodes 37 and 38. The gate of the NMOSFET 33 is connected to the power supply potential $V_{EE}$ through a drain and a source of an NMOSFET 36. A PMOSFET 34 has a gate connected to the interconnection L0, a source connected to the power supply potential $V_{CC}$, and a drain connected to a drain of an NMOSFET 35 and a gate of the NMOSFET 36. The NMOSFET 35 has a gate connected to the power supply potential $V_{CC}$ and a source connected to the power supply potential $V_{EE}$.

Description is now made on the driver circuit 4. The output node b in the level converting circuit 3 is connected to a base of a bipolar transistor 41. The output node b is also connected to an input terminal of a CMOS inverter 44 comprising a PMOSFET 42 and an NMOSFET 43. The CMOS inverter 44 has an output terminal connected to an input terminal of a CMOS inverter 47 comprising a PMOSFET 45 and an NMOSFET 46. The bipolar transistor 41 has a collector connected to a power supply potential $V_{CC}$, and an emitter connected to an output terminal of the CMOS inverter 47 and connected to the output node b in the level converting circuit 3 through an anode and a cathode of a diode 48. The output terminal of the CMOS inverter 47 is an output node c in the driver circuit 4, and a selecting line is connected to the output node c.

Description is now made on operation of the circuit shown in FIG. 5.

It is assumed that the address signal $A_0$ is changed from an "H" level ($=-0.9$ V) to an "L" level ($=-1.7$ V). When the address signal $A_0$ applied to the base of the bipolar transistor 11 is changed from the "H" level to the "L" level, the potential of the collector of the bipolar transistor 13 is changed from the "L" level to the "H" level and the collector potential of the bipolar transistor 14 is changed from the "H" level to the "L" level. Therefore, the potential of the emitter of the first multi-emitter transistor 16 is changed from the "L" level to the "H" level and the emitter potential of the second multi-emitter transistor 17 is changed from the "H" level to the "L" level. Thus, the potential of the output node $\overline{a_0}$ attains the "H" level.

The potential of the output node $\overline{a_0}$ at the "H" level equals $V_{CC}-V_{BE}$, and the potential of the output node $\overline{a_0}$ at the "L" level equals ($V_{CC}-V_{BE}$-resistance of the resistor 18× current flowing through the constant current source 31), where $V_{BE}$ is voltage ($\approx 0.8$ V) between the base and the emitter of the multi-emitter transistor 16. The "L" level is adjusted in advance to a level at which the PMOSFET 32 in the level converting circuit 3 is turned on.

When the potential of the output node $\overline{a_0}$ of the address buffer circuit 1 is changed from the "L" level to the "H" level, the PMOSFETs 32 and 34 are turned off. Since the NMOSFET 35 is always turned on, the potential of the gate of the NMOSFET 36 equals $V_{EE}$, so that the NMOSFET 36 is turned off. Furthermore, the gate potential of the NMOSFET 33 equals about the potential of the output node $\overline{a_0}$. Therefore, the NMOSFET 33 is turned on, so that the potential of the output node b in level converting circuit 3 is changed from the "H" level ($V_{CC}$) to the "L" level ($V_{EE}$). More specifically, the ECL level is converted into the MOS level.

When the potential of the output node b in the level converting circuit 3 is changed from the "H" level to the "L" level, the potential of the output node c in the driver circuit 4 is changed from the "H" level ($V_{CC}$) to the "L" level ($V_{EE}$) by the two CMOS inverters 44 and 47. At the same time, the bipolar transistor 41 is turned off, so that current flows from the output node c to the output node b in the level converting circuit 3 through the diode 48. The current flows to the power supply potential $V_{EE}$ through the NMOSFET 33. As a result, the rising time of the potential of the output node c is advanced.

It is assumed that the address signal $A_0$ is changed from the "L" level ($=-1.7$ V) to the "H" level ($=-0.9$ V). When the address signal $A_0$ applied to the base of the bipolar transistor 11 is changed from the "L" level to the "H" level, the collector potential of the bipolar transistor 13 is changed from the "H" level to the "L" level and the collector potential of the bipolar transistor 14 is changed from the "L" level to the "H" level. Therefore, the emitter potential of the first multi-emitter transistor 16 is changed from the "H" level to the "L" level and the emitter potential of the second multi-emitter transistor 17 is changed from the "L" level to the "h" level.

At that time, when the potentials of the output nodes in all of the address buffer circuits 1 connected to the interconnection L0 attain the "L" level, the potential of the interconnection L0 attains the "L" level, so that the interconnection L0 is selected.

When the potential of the interconnection L0 attains the "L" level, the PMOSFET 32 is turned on and the NMOSFET 33 is turned off. Therefore, the potential of the output node b in the level converting circuit 3 is changed from the "L" level ($V_{EE}$) to the "H" level ($V_{CC}$). At the same time, the PMOSFET 34 is turned on. The gate potential of the NMOSFET 36 is determined by the ratio of on-resistances of the PMOSFET 34 and the NMOSFET 35. The ratio of the on-resistances are adjusted in advance such that the NMOSFET 36 is also turned on when the PMOSFET 34 is turned on. Thus, the NMOSFET 36 is turned on.

Current pulled from the output node $\overline{a_0}$ to the power supply potential $V_{EE}$, when the potential of the output node $\overline{a_0}$ in the address buffer circuit 1 attains "L" level, flows to the constant current source 31 and also flows to the NMOSFET 36 through the level shift diodes 37 and 38, so that load capacitance connected to the output node $\overline{a_0}$ is discharged at the high speed. As a result, the potential of the selected interconnection L0 is changed from the "H" level to the "L" level.

When the potential of the output node b in the level converting circuit 3 is changed from the "L" level to the "h" level, the potential of the output node c is changed from the "L" level ($V_{EE}$) to the "H" level ($V_{CC}$) by the two CMOS inverters 44 and 47. At the same time, the bipolar transistor 41 is turned on and current flows from the power supply potential $V_{CC}$ to the output node c, so that the potential of the output node c rises from the "L" level to the "H" level at the high speed.

Therefore, when the potential of the interconnection L0 is changed from the "H" level to the "L" level, much current flows from the gate of the PMOSFET 32 to the power supply potential $V_{EE}$, so that the change of the level from the "H" level to the "L" level can be performed at the higher speed. In this case, since current is increased only in the level converting circuit 3 selected when the potential of the interconnection L0 attains the "L" level and current is not increased in the other level converting circuits which are not selected, consumed current is slightly increased as a whole.

Meanwhile, a lot of memory cells are generally connected to the output node c in the driver circuit 4, so that large load capacitance is added. When the potential of the output node c falls from the "H" level to the "L" level, current flows from the output node c to the diode 48. When the potential of the output node c rises from the "L" level to the "H" level, current flows from the bipolar transistor 41 to the output node c, so that the rising and the falling of the potential of the output node c can be performed at the high speed.

Additionally, the potential of the output node c is fully swung from the $V_{EE}$ level to the $V_{CC}$ level by the CMOS inverter 47.

Although in the driver circuit according to the above described embodiment, the diode 48 is interposed between the base and the emitter of the bipolar transistor 41 so that the falling of an output is performed at the higher speed, it is not intended to be limited. For example, the other elements may be used which are rendered conductive when a reverse bias voltage applied between the base and the emitter of the bipolar transistor 41 is larger than the constant value.

Although in the above described embodiment, the driver circuit according to the present invention is applied to the Bi-CMOS·RAM, the driver circuit can be also applied to the other semiconductor memory devices and further the other various circuit devices, so that a load can be driven at the high speed.

As described in the foregoing, according to the present invention, since the speed of the rising and the falling of an output signal with the change of an input signal are increased by a first semiconductor element and a second semiconductor element and an output portion comprises a CMOS inverter circuit, the output signal is changed from the potential of a first potential source to the potential of a second potential source over a wide range.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A driver circuit for amplifying current of an input signal of a first logical level or a second logical level and supplying the amplified current to a load, comprising an input terminal coupled to said input signal,
an output terminal,
a first potential source for applying a potential corresponding to the first logical level,
a second potential source for applying a potential corresponding to the second logical level,
a first CMOS inverter circuit responsive to the signal applied to said input terminal for deriving to said output terminal the potential of said first potential source or the potential of said second potential source,
a first semiconductor element for passing current from said first potential source to said output terminal when the sginal applied to said input terminal is changed from the second logical level to the first logical level, and
a second semiconductor element for passing current from said output terminal to said second potential source when the signal applied to said input terminal is changed from the first logical level to the second logical level.

2. A driver circuit according to claim 1, wherein said first semiconductor element comprises one conduction terminal connected to the first potential source, the other conduction terminal connected to said output terminal and a control terminal connected to said input terminal, and is rendered conductive from said one conduction terminal to said other conduction terminal when the signal applied to said input terminal attains the first logical level.

3. A driver circuit according to claim 1, wherein said second semiconductor element comprises one conduction terminal connected to said input terminal and the other conduction terminal connected to said output terminal, and is rendered conductive from said other conduction terminal to said one conduction terminal.

4. A driver circuit according to claim 2, wherein said second semiconductor element comprises one conduction terminal connected to said input terminal and the other conduction terminal connected to said output terminal, and is rendered conductive from said other conduction terminal to said one conduction terminal.

5. A driver circuit according to claim 4, which further comprises a switching element connected between said input terminal and said second potential source which is rendered conductive when the input signal applied to said input terminal is changed to the second logical level.

6. A driver circuit according to claim 1, wherein said first CMOS inverter circuit comprises an MOS transistor of a first conductivity channel type connected between said first potential source and said output terminal and having a gate terminal coupled to the input signal applied to said input terminal and an MOS transistor of a second conductivity channel type connected between said output terminal and said second potential source and having a gate terminal connected to the gate terminal of said MOS transistor of the first conductivity channel type.

7. A driver circuit according to claim 1, which further comprises a second CMOS inverter circuit between said input terminal and said first CMOS inverter circuit.

8. A driver circuit according to claim 2, wherein said first semiconductor element comprises a bipolar transistor.

9. A driver circuit according to claim 3, wherein said first semiconductor element comprises a bipolar transistor.

10. A driver circuit according to claim 3, wherein said second semiconductor element comprises a diode.

* * * * *